United States Patent
Yim

[19]

[11] Patent Number: 6,124,152
[45] Date of Patent: Sep. 26, 2000

[54] METHOD FOR FABRICATING COB TYPE SEMICONDUCTOR PACKAGE

[75] Inventor: Choong Bin Yim, Kyungki-do, Rep. of Korea

[73] Assignee: LG Semicon Co., Ltd., Chungcheongbuk-do, Rep. of Korea

[21] Appl. No.: 09/178,617

[22] Filed: Oct. 26, 1998

[30] Foreign Application Priority Data

Jan. 14, 1998 [KR] Rep. of Korea ............................ 98-865

[51] Int. Cl.[7] ............................ H01L 21/44; H01L 21/48; H01L 21/50
[52] U.S. Cl. ............................ 438/126; 438/106; 438/121; 438/123
[58] Field of Search ............................ 438/126, 123, 438/121, 106

[56] References Cited

U.S. PATENT DOCUMENTS 5,548,884  8/1996  Kim .
5,833,903  11/1998  Centofante .
5,849,609  12/1998  Chun .

OTHER PUBLICATIONS

IEEE/CPMT International Electronics Manufacturing Technology symposium p. 109–111 (1995).

*Primary Examiner*—Kevin M. Picardat
*Assistant Examiner*—D. M. Collins

[57] ABSTRACT

Method for fabricating a COB type semiconductor package, which is suitable for simplifiing a process from wire bonding to milling, including the steps of (1) mounting chips on a COB film having a plurality of bond holes formed therein, (2) electrically connecting the chips to inside portions of the COB film through the bond holes, (3) placing a solid state EMC(Epoxy Molding Compound) on a top surface of each of the chips, and (4) heating the solid state EMC so that the EMC covers wires and the chips.

13 Claims, 4 Drawing Sheets

METHOD FOR FABRICATING COB TYPE SEMICONDUCTOR PACKAGE

BACKGROUND OF THE INVENTION

1. Field of the Invention

The present invention relates to a method for coating a COB(Chip On Board) type semiconductor package, and more particularly, to a method for fabricating a COB type semiconductor package, which is suitable for simplifying a process from wire bonding to milling.

2. Discussion of the Related Art

In general, semiconductor packages are either a hole inserting type or a surface mounting type. In the hole inserting type package, there are holes in a printed circuit board for inserting and soldering leads or pins thereto. On the other hand, in the surface mounting type package, inserting holes are not required, and ICs are mounted on a surface of a printed circuit board. This surface mounting type package allows mounting of the ICs on both sides of the printed circuit board leading to a significant improvement of an IC density mounted on the printed circuit board, enabling a package that is lighter, thinner, shorter and smaller to be obtained. Currently, surface mounting type packages come in subtypes of SOP(Small Outline Package), TSOP(Thin Small Outline Package), SOJ(Small Outline J-bend), and TQFP(Thin Quad Flat Package).

In general, a semiconductor package is fabricated according to the steps, including die sawing to separate a wafer into individual chips, die attaching to connect bond each of the chips separated into individual devices on a lead frame with conductive epoxy, wire bonding for connecting the chip bonded on the lead frame to leads on the lead frame with gold wire, molding to encapsulate the chip having the Ye bonding completed for protecting the chip against external impact, and soldering for dipping ends of outer leads into molten solder to coat with solder to improve a conductivity, trimming and forming.

In addition, a COB(Chip-On-Board) package technology is suitable for reducing cost of the COC(Chip-On-Chip) solution, and include the steps of die bonding to bond chips on epoxy coated on bonding positions of a COB film, conducting a die bond baking to fix to the die(chip) bonded on the COB with epoxy, wire bonding to electrically connect the die bonded on the COB film to external terminals, and coating gold wire used in the wire bonding and chip to protect from external impact. There may also be a milling step to adjust a thickness of the chip as specified in the order.

A background art method for fabricating a COB type semiconductor package will be explained with reference to the attached drawings. FIG. 1A illustrates a plan view showing placing chips on a COB film and conducting wire bonding.

The background art COB type semiconductor package is provided with a COB film 1 having a plurality of bond holes 3 formed therein, chips 2 mounted on the COB film 1, gold wires 4 for connecting the chips 2 to the COB film through the bond holes 3. The COB film 1 is provided with an epoxy layer of a base layer, a capacitor layer, an adhesive layer between the capacitor layer and the epoxy layer, a nickel layer under the capacitor layer, and a plating layer under the nickel layer. That is, the major feature of the COB type package is that chips 2 are directly bonded on the COB film. After connecting the chips 2 and the COB film 1 through the bond holes 3 with gold wires 4, a molding process is conducted for protecting the chips 1. This molding process may be called a coating process.

FIGS. 1B and 1C illustrate sections showing the coating process of the background art semiconductor package.

Referring to FIG. 1B, after bonding chips 2 on the COB film 1, the chips 2 and the COB film 1 are electrically connected with gold wires 4. In the connection, the chips 2 are connected to inner portions of the COB film 1 through the bond holes 3. Liquid resin 6 is applied to the chip 2 through a nozzle 5, for protecting exposed chips 2 and gold wires 4, which can break from a minor impact. As shown in FIG. 1C, after completion of liquid resin coating of the chips 2 and the gold wires 4, the liquid resin is cured to form a solid state body 8. Then, the body 8 is milled as the order specified using a cutting head 7.

However, the background art method for fabricating the COB semiconductor package has the following problems.

First, there may be a gap between the chip and the COB film caused by a defective die bonding process, bonding the chips on the COB film, which forms an inner void that degrades the reliability of the coating process.

Second, expensive coating equipments for coating the resin and complicated robot arms for adjusting coated resin are required, resulting in a complicated fabrication process.

Third, the milling process, required by an order specification increases production cost.

Fourth, precise control of liquid resin deposition is sometimes difficult due to the nozzle being blocked or contaminated while applying the liquid resin.

Fifth, the temperature control of a heater provided around the nozzle must be constantly monitored because the nozzle is very sensitive to a temperature changes.

Sixth, turn around time is long due to the long curing time required to cure the liquid resin.

Seventh, gases and foreign matters may be trapped when filling the liquid resin from a supply container to a storage tank. This may cause the nozzle to operate incorrectly.

Eighth, the liquid resin may only be stored 6 months or less.

SUMMARY OF THE INVENTION

Accordingly, the present invention is directed to a method for fabricating a COB type semiconductor package that substantially obviates one or more of the problems due to limitations and disadvantages of the related art.

An object of the present invention is to provide a method for fabricating a COB type semiconductor package that can simplify a fabrication process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating a COB type semiconductor package includes the steps of (1) mounting chips on a COB film having a plurality of bond holes formed therein, (2) electrically connecting the chips to inside portions of the COB film through the bond holes, (3) placing a solid state EMC(Epoxy Molding Compound) on a top surface of each of the chips, and (4) heating the solid state EMC so that the EMC covers wires and the chips.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 1A~1C illustrate the steps of a background art fabricating process of a COB type semiconductor package, wherein FIG. 1A illustrates a plan view showing conduction of wire bonding to the COB film and the chips after placing the chips on the COB film, FIG. 1B illustrates a section showing application of liquid resin to chips after the wire bonding, and FIG. 1C illustrates a section showing conduction milling after the application of liquid resin;

FIGS. 2A~2E illustrate the steps of a fabricating process of a COB type semiconductor package in accordance with a preferred embodiment of the present invention, wherein FIG. 2A illustrates a plan view showing conduction of wire bonding to the COB film and the chips after placing the chips on the COB film, FIG. 2B illustrates a section showing placing a piece of solid state EMC on tops of chips after the wire bonding, FIG. 2C illustrates a section showing the solid state EMC placed on top of chips, FIG. 2D illustrates a state in which press tools are lowered down just before gluey EMC are pressed down, and FIG. 2E illustrates a state after the gluey EMC are pressed down by the lowered press tools.

DETAILED DESCRIPTION OF THE PREFERRED EMBODIMENT

Figure 1A:
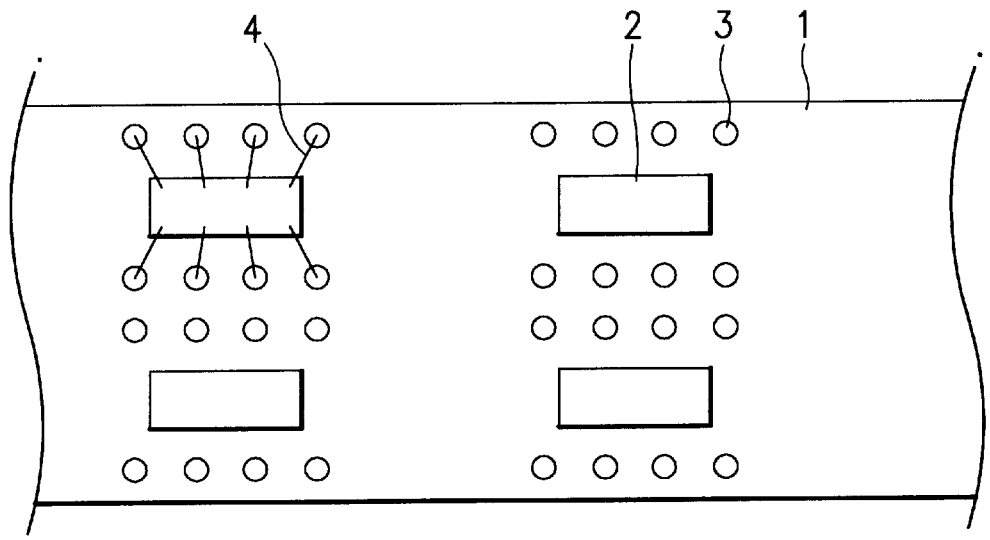
Figure 1B:
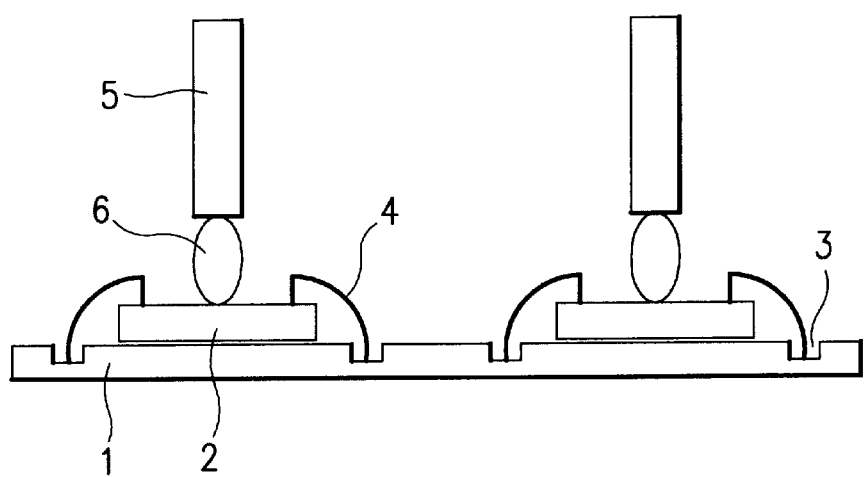
Figure 1C:
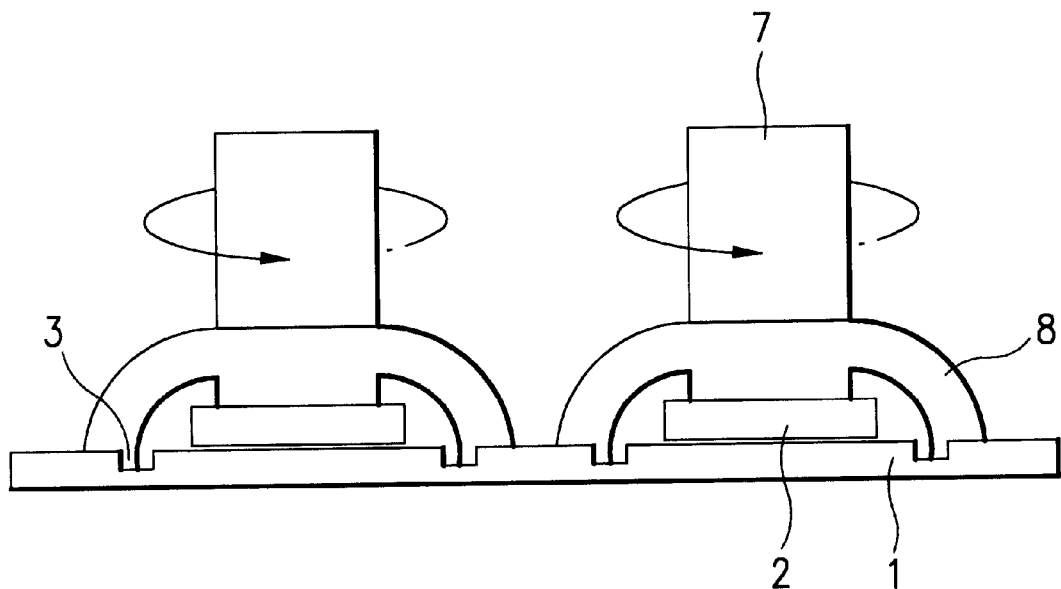
Figure 2A:
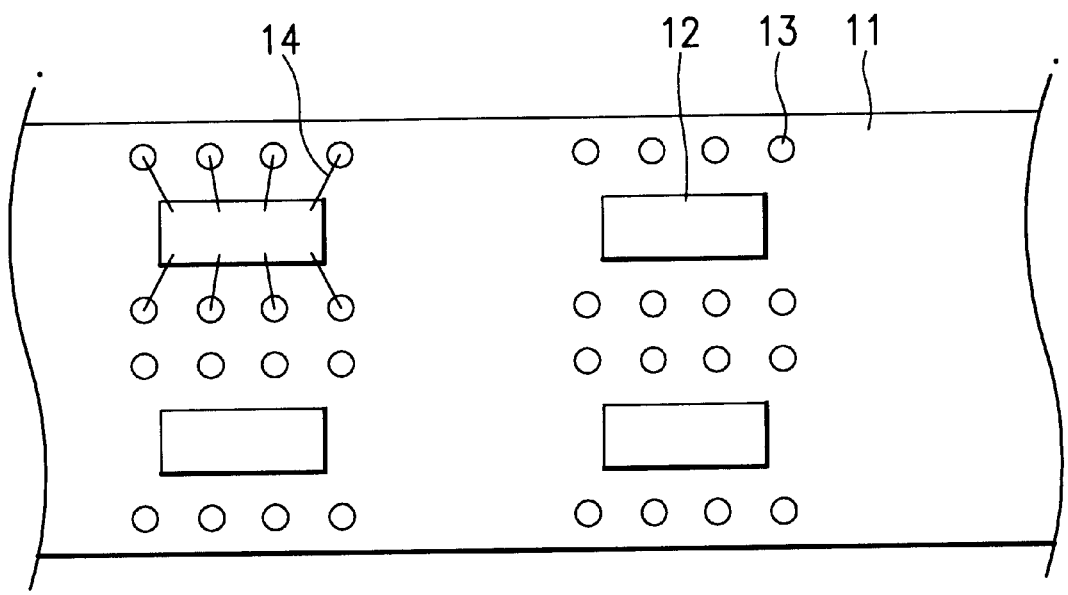

Reference will now be made in detail to the preferred embodiments of the present invention, examples of which are illustrated in the accompanying drawings. FIG. 2a illustrates a plan view showing conduction of wire bonding to the COB film and the chips after placing the chips on the COB film.

Referring to FIG. 2A, the COB type semiconductor package of the present invention includes a COB film 11 having a plurality of bond holes 13 formed therein, chips 12 mounted on the COB film 11, and gold wires 14 connected between the chips 12 and the COB film 11. Like the background art, the COB film 11 also has an epoxy layer of a base layer, a capacitor layer, an adhesive layer between the capacitor layer and the epoxy layer, a nickel layer under the capacitor layer, and a plating layer under the nickel layer. After the COB film 11 are electrically connected to the chips 12 using the gold wires 14, the chips 11 on the COB film 11 and the gold wires 14 are subjected to a coating process for protection a coating process.

FIGS. 2B–2E illustrate sections showing the steps of a coating process of a COB type semiconductor package in accordance with a preferred embodiment of the present invention.

Figure 2B:
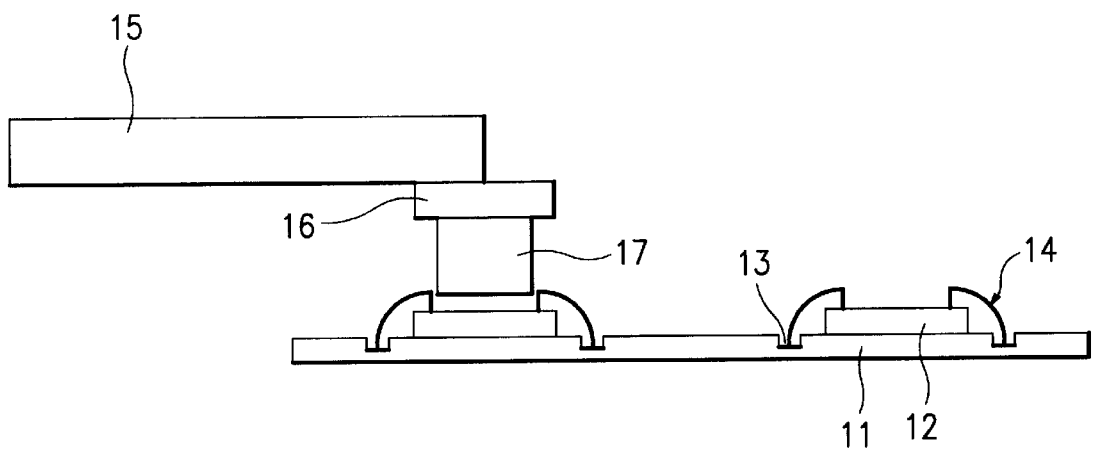
Figure 2C:
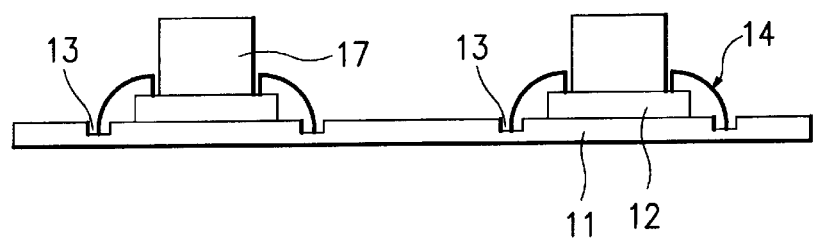

As shown in FIG. 2B, the coating process starts with bonding chips 12 on a COB film 11, and electrically connecting the chips 12 and the COB film 11 with gold wires 14. The chips 11 are electrically connected to the COB film 11 through bond holes 13 formed in the COB film 11. After completion of the wire bonding process, a piece of solid state EMC tablet 17 is placed on a center of each of the chips 12 by an EMC holder 16 mounted on an EMC(Epoxy Molding Compound) carrier 15. That is, the EMC holder 16 in the EMC carrier 15 mounted on the wire bonding equipment picks-up an EMC tablet 17, brings it over to a center of the chip 12, and places it on a top surface of the chip 12 as shown in FIGS. 2B and 2C. This operation may be monitored with a CCD camera(not shown) mounted on art the wire bonding equipment.

Figure 2D:
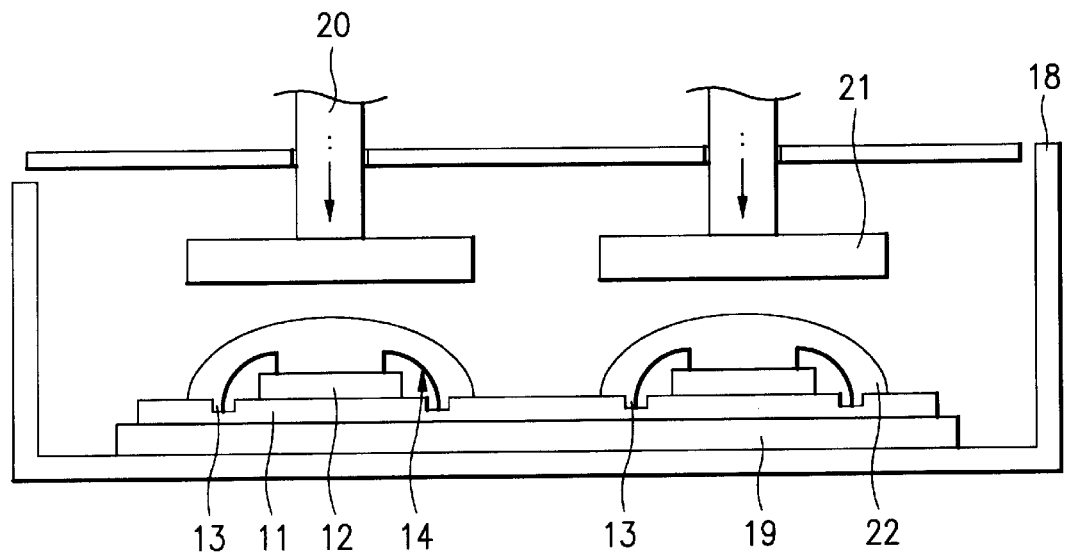

A volume of the solid state EMC tablet 17 mounted on the top of the chip 12 should be large enough to cover the chip 12. The solid state EMC tablet 17 maybe kneaded into cylinder, cone, or other forms, as explained later. As shown in FIG. 2D, the wire bonding is completed and the EMC tablets are placed on chips, the COB film 11 is moved to a curing equipment 18 along an index rail 19 to be cured. When the solid state EMC tablet 17 is heated to 175±10° C. and within 10~20 seconds, the solid state EMC tablet 17 melts into a liquified EMC 220. This process is such that the liquefied EMC 22 covers the chips and wires by surface tension which minimizes a surface of its own with an arch. As shown in FIG.2D after 20~35 seconds at the elevated temperature of 175±10° C., the liquified EMC 22 is slowly hardened into gluey state.

Figure 2E:
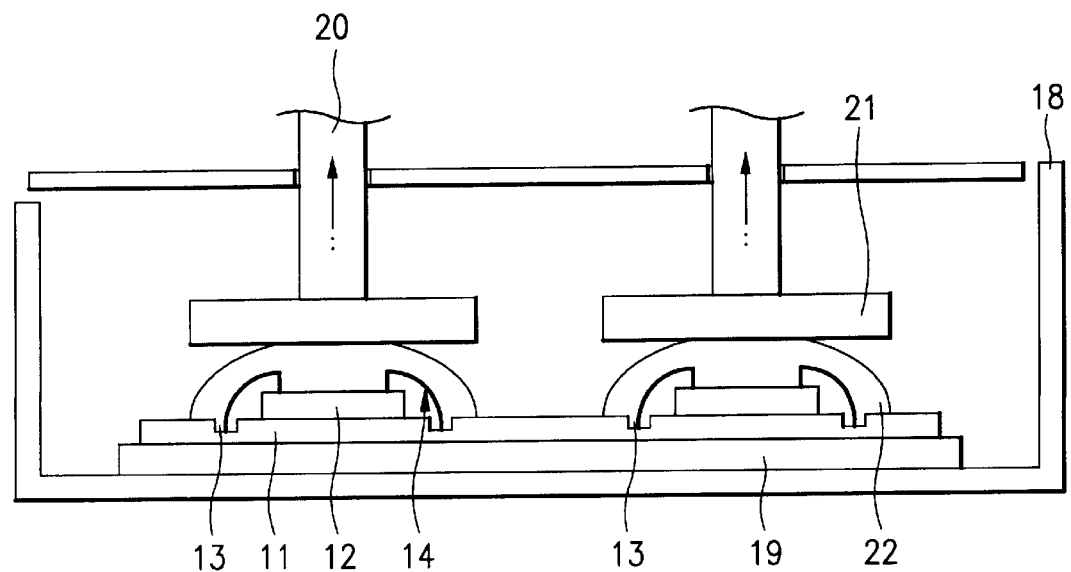

As shown in FIGS. 2D and 2E, gluey state of EMC is pressed down with a press tool 21 at an end of a press bar 20 until a required thickness is achieved. That is, after the liquified EMC 22 is turned into a gluey state, the EMC is pressed down with the press tool 21, to adjust a thickness of the coated EMC. A marking on a surface of a package may be made at the same time the thickness is adjusted, if the press tool 21 is properly casted. After the EMC thickness is adjusted approx. 35 seconds have elapsed at the elevated temperature 175±10° C., the gluey EMC is hardened a solid state. However, because of bonding forces between molecules, the package of the present invention can have a satisfactory hardness even if a curing time period is shortened. Even though 175±10° C. is preferred, the curing is possible at 140~200° C., since the chip 12 can withstand temperatures up to approx. 250° C.

Following is a description of how the solid state tablet is prepared.

An epoxy resin is mixed with filler, and kept at an elevated temperature of 110~120° C. for 1~2 minutes, to form an EMC gel. The EMC gel is quenched into powder, and punched into the solid state EMC tablet. This solid state EMC tablet formation process is referred to as a kneading process.

The method for fabricating a COB type semiconductor package of the present invention has the following advantages.

First, the series of continuous process from wire bonding to curing provided in the present invention with omission of the milling allows the process time to be shortened and productivity to be improved. This is possible because after completion of the wire bonding and placement of the solid state EMC on top of the EMC, the COB film 11 is indexed to move directly along the index rail 19 to the curing equipment 18 where the coating and curing take place and shorten the process. The productivity is improved because the process minimizes defects from occuring, thereby providing highly reliable COB type semiconductor packages.

Second, the defects that occur during die bonding, in which the chips are bonded on the COB film, is eliminated because the liquefied EMC, as it slowly flows to cover the chip, eliminates air in gaps between the chip and the COB film, and thus prevents inner voids from being created in the package after the coating. That is, the solid state EMC filters into gaps between chips and the COB film naturally and closely, preventing formation of the unfilled inner voids.

Third, the bonding force between molecules of the solid state EMC tablet enables satisfactory hardness to be obtained even with a shortened curing time period.

Fourth, the solid state EMC can be stored for much longer period when compared to the liquid resin of the background art. The solid state EMC can be stored for more than a year.

Fifth, the solid state EMC eliminates EMC loss and the entrapment of gas or foreign matter.

It will be apparent to those skilled in the art that various modifications and variations can be made in the method for fabricating a COB type semiconductor package of the present invention without departing from the spirit or scope of the invention. Thus, it is intended that the present invention cover the modifications and variations of this invention provided they come within the scope of the appended claims and their equivalents.

What is claimed is:

1. A method for fabricating a COB (Chip On Board) type semiconductor package, comprising:
   (1) mounting chips on a COB film having a plurality of bond holes formed therein;
   (2) electrically connecting the chips to inside portions of the COB film through the bond holes;
   (3) placing a solid state EMC (Epoxy Molding Compound) on a top surface of each of the chips; and,
   (4) heating the solid state EMC so that the EMC covers wires and the chips.

2. A method as claimed in claim 1, wherein, in the step (4), the solid state EMC is heated sufficiently to liquify.

3. A method as claimed in claim 2, wherein the EMC is heated sufficiently to be transformed from the solid state to a gluey state.

4. A method as claimed in claim 3, further comprising:
   (5) pressing the gluey EMC.

5. A method as claimed in claim 1, wherein the heating in step (4) is carried out at a temperature ranging 140–200° C.

6. A method as claimed in claim 5, wherein the heating in step (4) is carried out preferably at a temperature of 175±10° C.

7. A method as claimed in claim 6, wherein the solid state EMC is liquefied in 10–20 seconds after being heated to 175±10° C.

8. A method as claimed in claim 6, wherein the solid state EMC is turned into a gluey state in 20–35 seconds after being heated to 175±10° C.

9. A method as claimed in claim 6, wherein the solid state EMC is hardened again into a solid state approx. 35 seconds after being heated to 175±10° C.

10. A method as claimed in claim 4, wherein the EMC is pressed down to adjust a coating thickness of the EMC.

11. A method as claimed in claim 10, further comprising:
    (6) marking the EMC.

12. The method of claim 11, wherein steps (5) and (6) are performed simultaneously.

13. A method of kneading a solid state EMC, comprising:
    (1) mixing epoxy resin with a filler;
    (2) forming an EMC gel;
    (3) quenching the EMC gel into a powder; and
    (4) punching the EMC gel into a tablet.

* * * * *